United States Patent
Hsu et al.

(10) Patent No.: US 6,746,910 B2
(45) Date of Patent: Jun. 8, 2004

(54) METHOD OF FABRICATING SELF-ALIGNED CROSS-POINT MEMORY ARRAY

(75) Inventors: Sheng Teng Hsu, Camas, WA (US); Wei Pan, Vancouver, WA (US); Wei-Wei Zhuang, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 10/262,222

(22) Filed: Sep. 30, 2002

(65) Prior Publication Data

US 2004/0063274 A1 Apr. 1, 2004

(51) Int. Cl.[7] .................... H01L 21/8234; H01L 21/00
(52) U.S. Cl. ..................... 438/238; 438/3; 438/240
(58) Field of Search ................... 438/3, 237–257, 438/240, 422, 243, 259, 266, 270, 381, 386–399

(56) References Cited

U.S. PATENT DOCUMENTS

| | | | |
|---|---|---|---|
| 6,204,139 B1 | | 3/2001 | Liu et al. |
| 6,569,745 B2 | * | 5/2003 | Hsu ........................... 438/385 |
| 6,583,003 B1 | * | 6/2003 | Hsu et al. .................. 438/238 |

OTHER PUBLICATIONS

Liu et al., *Electric–pulse–induced reversible resistance change effect in magnetoresistive films*, Applied Physics Letters, vol. 76, No. 19; May 8, 2000, pp 2749–2751.

\* cited by examiner

Primary Examiner—Jack Chen
Assistant Examiner—Thanh Nguyen
(74) Attorney, Agent, or Firm—David C. Ripma; Matthew D. Rabdau

(57) ABSTRACT

A method of fabricating a self-aligned cross-point memory array includes preparing a substrate, including forming any supporting electronic structures; forming a p-well area on the substrate; implanting ions to form a deep $N^+$ region; implanting ions to form a shallow P+ region on the $N^+$ region to form a P+/N junction; depositing a barrier metal layer on the P+ region; depositing a bottom electrode layer on the barrier metal layer; depositing a sacrificial layer or silicon nitride layer on the bottom electrode layer; patterning and etching the structure to remove portions of the sacrificial layer, the bottom electrode layer, the barrier metal layer, the P+ region and the $N^+$ region to form a trench; depositing oxide to fill the trench; patterning and etching the sacrificial layer; depositing a PCMO layer which is self-aligned with the remaining bottom electrode layer; depositing a top electrode layer, patterning and etching the top electrode layer, and completing the memory array structure.

22 Claims, 4 Drawing Sheets

METHOD OF FABRICATING SELF-ALIGNED CROSS-POINT MEMORY ARRAY

RELATED APPLICATIONS

This application is related to Ser. No. 10/072,225, filed Feb. 7, 2002, for Device and method for reversible resistance change induced by electric pulses in non-crystalline perovskite unipoar programmable memory; Ser. No. 10/256,358, filed Sep. 26, 2000, for Method for resistance switch using short electric pulses; Ser. No. 10/391,292, filed Mar. 17, 2003, for Cross-point resistor memory array and method fabrication the same; and Ser. No. 10/391,290, filed Mar. 17, 2003, for Trench Isolated Cross-Point Memory Array and Method of Fabrication the Same.

FIELD OF THE INVENTION

This invention relates to high-density cross-point resistor memory arrays ULSI memory chip and embedded memory application

BACKGROUND OF THE INVENTION

Perovskite metal oxide thin films, such as $Pr_{0.7}Ca_{0.3}MnO_3$ (PCMO) thin films, have reversible resistance change properties, which can be used in non-volatile memory devices for information storage. Known methods to induce the resistance change include application of a short electric pulse for writing and a long electric pulse for resetting, wherein both electric pulses have the same polarity.

PCMO thin films exhibit reversible resistance change when an electric pulse is applied. A PCMO thin film has been grown on both epitaxial $YBa_2Cu_3O_7$ (YBCO) and partial applied. A PCMO thin film has been grown on both epitaxial $YBa_2Cu_3O_7$ (YBCO) and partial epitaxial platinum substrates via pulsed laser ablation (PLA) technique, Liu et al., *Electric-pulse-induced reversible resistance change effect in magnetoresistive films*, Applied Physics Letters, 76, 2749, 2000; and Liu et al., U.S. Pat. No. 6,204,139, granted Mar. 20, 2001, for *Method of switching the properties of perovskite materials used in thin film resistors*. X-Ray diffraction (XRD) polar figures confirm the epitaxial properties of PCMO thin films.

U.S. Pat. No. 6,204,139 describes the resistance change which occurred when electric pulses were applied at room temperature to PCMO thin films. The PCMO thin films were deposited on both epitaxial $YBa_2Cu_3O_7$ (YBCO) and partial epitaxial platinum substrates by pulsed laser deposition (PLD). The polarity of the electric pulse determines the character of the resistance change, i.e., increase or decrease.

An electrically programmable resistance, non-volatile memory device, operable at room temperature, was made of PCMO epitaaially grown on YBCO on $LaAlO_3$, as published by Liu et al, however, the sample size was on the order of hundred of microns square, which is not practical for commercial production. This type of memory may be reversibly programmed by a reversed short electrical pulse. The memory cell is able to produce either single bit or multi-bit information. However, the PCMO must be in crystalline form, which requires that the PCMO must be grown on a specific bottom electrode, such as YBCO, which is not compatible to the state-of-the-art silicon integrated circuit technology. The growth, or crystallization, temperature is relatively high, e.g., >700° C., which makes integration of the device into state-of-the-art integrated circuit very complex. In addition it is not possible to cover the full circuit area with a single grain of PCMO. As the properties of a memory cell which is fabricated on a single grain PCMO crystal and the properties of a memory cell which is fabricated on a multi-grain PCMO crystal, which covers the grain boundary area, are not the same, circuit yield and memory performance problems will occur. A low $\Delta R/R$ ratio was reported for the Liu et at. sample. It is not believed that the Liu et al. technique can be applied to commercially manufactured non-volatile memory devices.

High-density memory devices, such as DRAM and flash memory, have small cell sizes, hence higher density integration is possible. Conventional DRAM, however, requires a complex fabrication process, and conventional flash memory requires high voltage programming and is difficult to scale down to sub-micron cell size.

SUMMARY OF THE INVENTION

A method of fabricating a self-aligned cross-point memory array includes preparing a substrate, including forming any supporting electronic structures; forming a swell area on the substrate; implanting ions to form a deep $N^+$ region; implanting ions to form a shallow $P+$ region on the $N^+$ region to form a $P+/N$ junction; depositing a barrier metal layer on the $P+$ region; depositing a bottom electrode layer on the barrier metal layer; depositing a sacrificial layer of polysilicon or silicon nitride on the bottom electrode layer; patterning and etching the structure to remove portions of the polysilicon layer, the bottom electrode layer, the barrier metal layer, the $P+$ region and the $N^+$ region to form a trench; depositing oxide to fill the trench; patterning and etching the polysilicon; depositing a PCMO layer which is self-aligned with the remaining bottom electrode layer; depositing a top electrode layer; patterning and etching the top electrode layer; and completing the memory array structure.

It is an object of the invention to provide a high density cross point resistor memory array having isolated PCMO cell pillars self-aligned to the bottom electrode.

Another object of the invention is to provide an array which has a small cell size, low leakage current, and low cross talk between memory cells.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENTS

This invention is a method of fabrication of a trench-isolated version of cross-point memory array, having an isolated colossal magnetoresistive oxide (CMR) cell resistor pillars, which, in the preferred embodiment, are formed on a perovskite material, such as $Pr_{0.7}Ca_{0.3}MnO_3$ (PCMO). The structure is able to achieve high device density and may be fabricated by processes compatible with state-of-the-art ULSI techniques.

Figure 1:
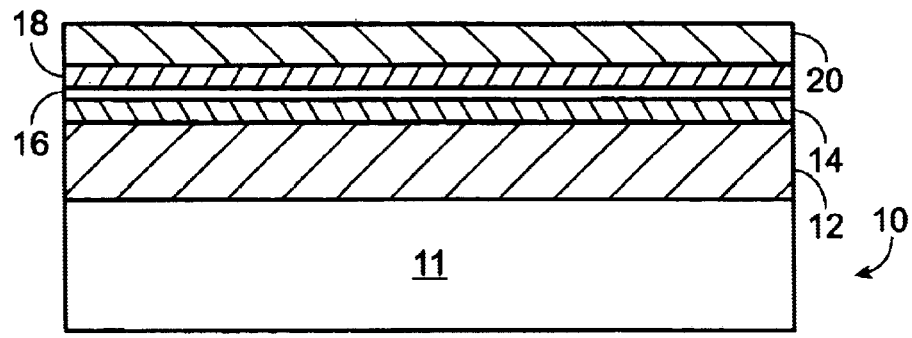
FIG. 1 is a cross section of an initial step in fabrication of the array of the invention.

The fabrication method of the invention, and now referring to FIG. 1, includes preparation of a suitable substrate and fabrication of the non-memory devices, which will be called "supporting electronics," by any state-of-the-art process, before fabrication of the PCMO pillar. The memory array is fabricated on a substrate 10 having a p-well area 11. The entire memory area is implanted with phosphorus to form a deep $N^+$ region 12. The energy of phosphorus ions for implantation is between about 60 keV to 200 keV and the ion dose is between about $5 \cdot 10^{14}$ ions/cm$^{-2}$ to $2 \cdot 10^{15}$ ions/cm$^{-2}$. Multi energy phosphorus may be used to reduce the resistivity of the $N^+$ layer, and requires implantation of phosphorus ions at an energy level of between about 100 keV to 250 keV and a dose of between about $1 \cdot 10^{14}$ ions/cm$^{-2}$ to $2 \cdot 10^{15}$ ions/cm$^{-2}$. A shallow layer 14 is implanted to form a $P^+/N$ junction. The shallow $P^+$ layer may be implanted with $BF_2$ ions at an energy level of between about 20 keV to 60 keV and a dose of between about $1 \cdot 10^{15}$ ions/cm$^{-2}$ to $5 \cdot 10^{15}$ ions/cm$^{-2}$.

FIG. 1 depicts the initial structure after the surface of the memory area has been cleaned to remove oxide following deposition of between about 10 nm to 50 nm of a barrier metal 16, such as TaN, TiN, WN, and TiTaN, and between about 50 nm to 300 nm of bottom electrode material 18, such as Pt and Ir. A sacrificial layer 20 of, in the preferred embodiment, polysilicon or silicon nitride, having a thickness of between about 200 nm to 400 nm is then deposited over the structure.

Figure 2:
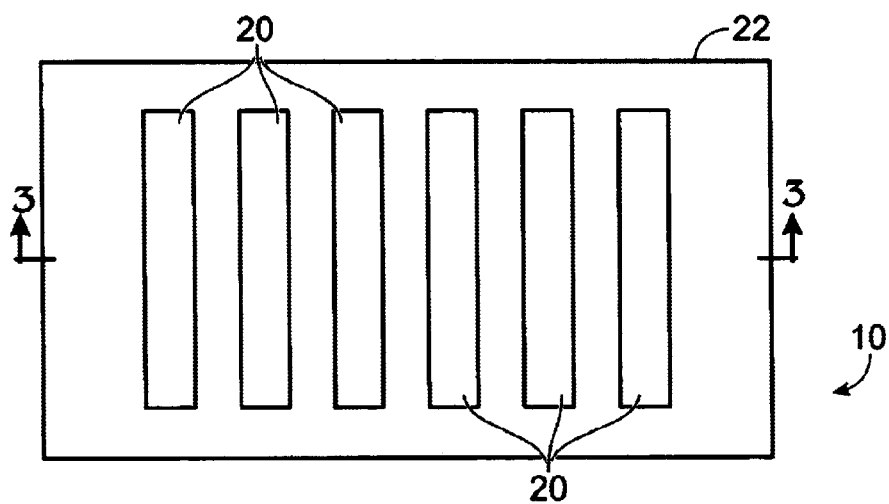
FIG. 2 is a top plan view of the array of FIG. 2.
Figure 3:
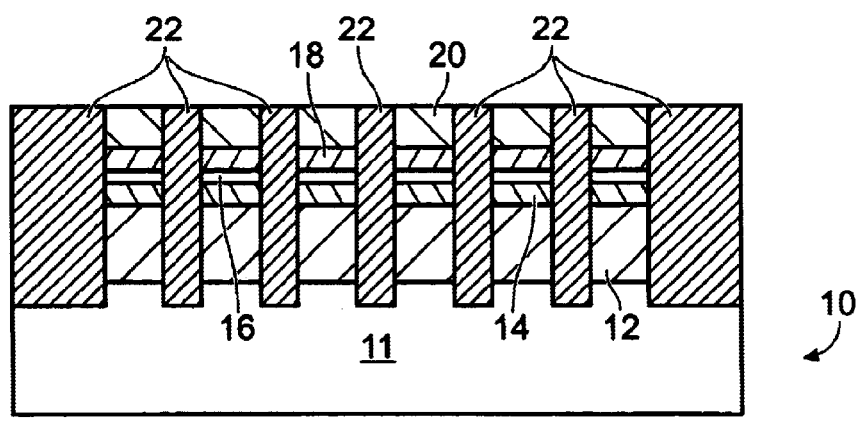
FIG. 3 is a cross-section of the array of FIG. 2, taken generally along line 3—3.

Referring now to FIG. 2, photoresist is deposited to pattern the active area. The structure is etched to remove portions of sacrificial layer 20, portions of bottom electrode 18, portions of barrier metal 16 and portions of $P^+$ silicon 14 and $N^+$ silicon 12. The photoresist is then removed. The etching process etches through $N^+$ silicon 12 into at least 10 nm of P-well 11. Any etch damage is cleaned and the etched trenches filled with oxide, which is then smoothed by CMP. FIG. 3 depicts the cross-section of FIG. 2 following the preceding steps.

Figure 4:
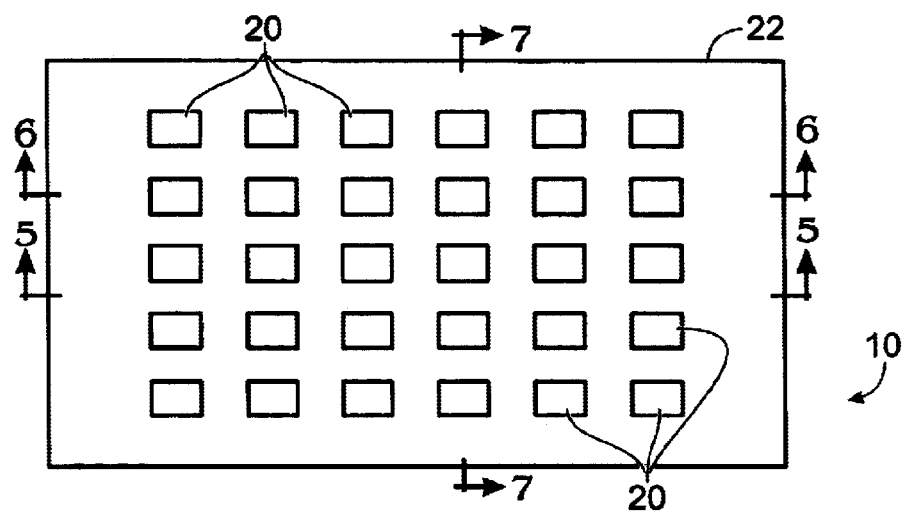
FIG. 4 is a top plan view of the array of FIG. 2, with metal interconnects not shown for purposes of clarity.
Figure 5:
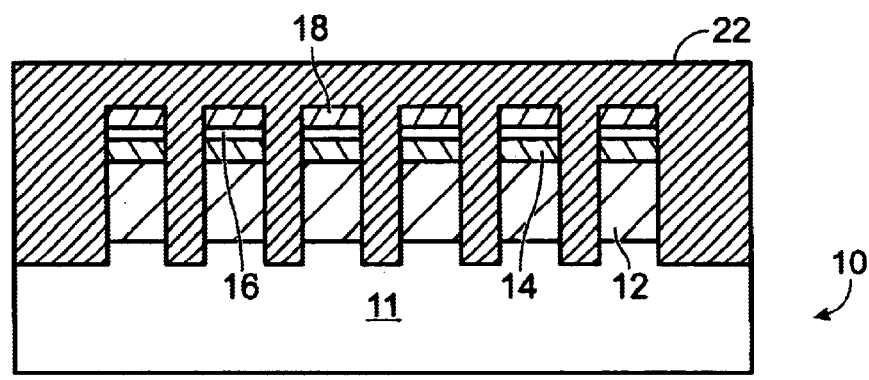
FIG. 5 is a cross-section of the array of FIG. 5, taken generally along line 5—5.
Figure 6:
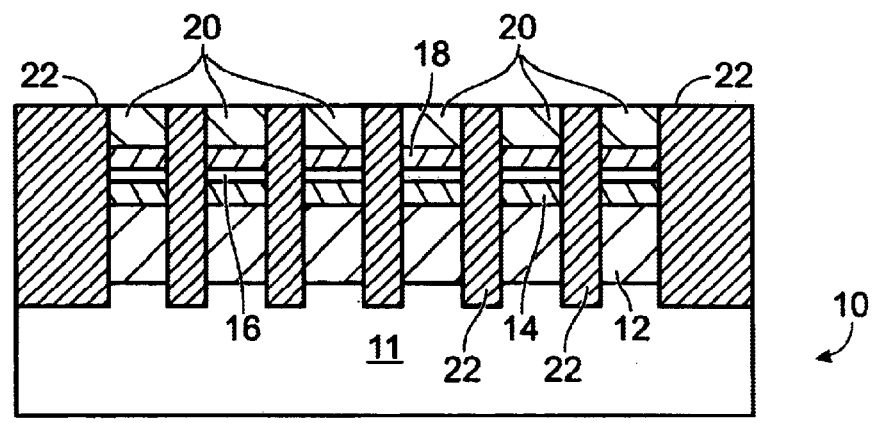
FIG. 6 is a cross-section of the array of FIG. 5, taken generally along line 6—6.
Figure 7:
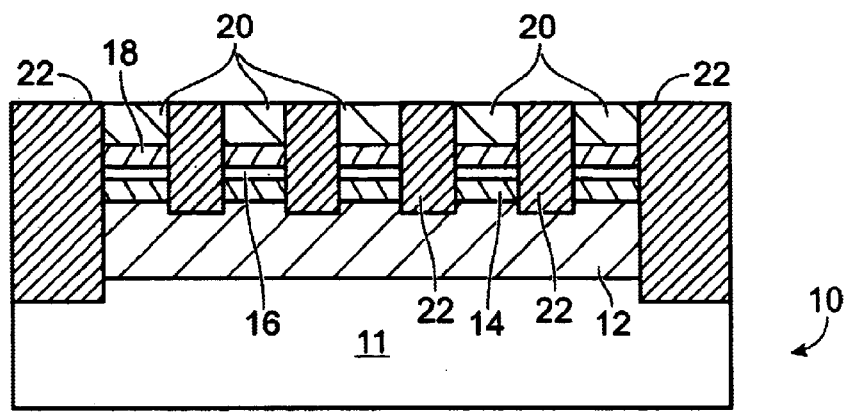
FIG. 7 is a cross-section of the array of FIG. 5, taken generally along line 7—7.

Turning now to FIG. 3, photoresist is deposited to protect the memory cell area. Sacrificial layer 20, bottom electrode 18, barrier metal 16 and $P^+$ layer 14 are etched, which may slightly etch into $N^+$ region 12. The photoresist is removed, and a layer of oxide 22 is deposited and smoothed by CMP. A top view of the structure at this stage is depicted in FIG. 4, and a cross-section along line 5—5 is depicted in FIG. 4. A cross section along line 6—6 is depicted in FIG. 6. FIG. 7 depicts the sacrificial layer which has not yet been replaced by PCMO, and is taken along line 7—7 of FIG. 4.

Figure 8:
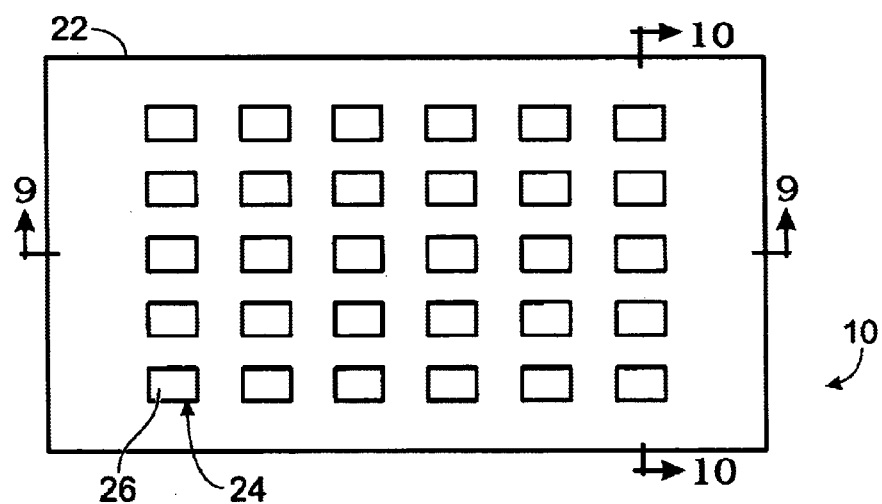
FIG. 8 is a top plan view of a memory array constructed according to the invention, with portions broken away to show detail.
Figure 9:
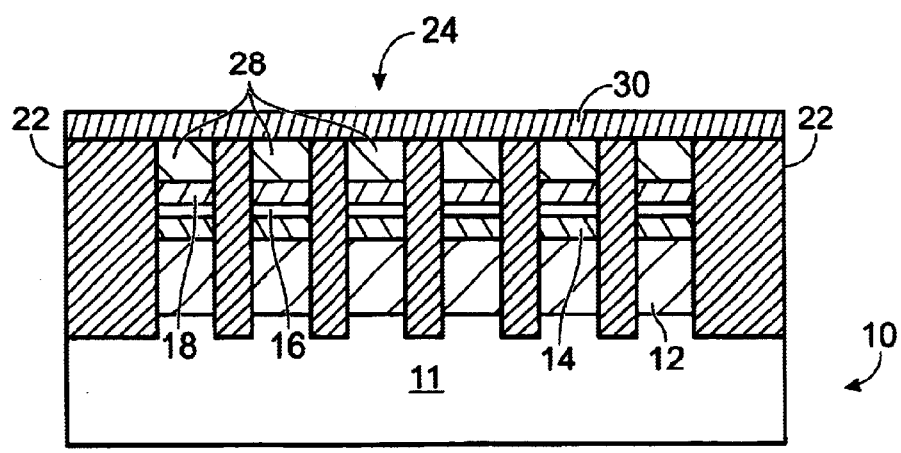
FIG. 9 is a cross-section of the array of FIG. 8, taken generally along line 9—9.
Figure 10:
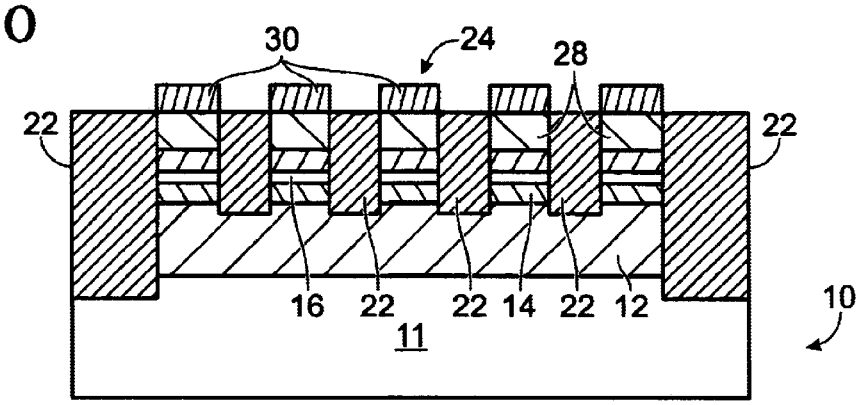
FIG. 10 is a cross-section of the array of FIG. 8, taken generally along line 10—10.

Sacrificial layer 20 is again etched and PCMO memory resistance material 28 is deposited and smoothed by CMP. A top electrode layer 30 is deposited and patterned with photoresist. The top electrode is etched, and the photoresist removed, resulting in the structure of FIGS. 8–10. FIG. 8 is a top plan view of a cross-point memory array structure, wherein some metal layers and over coating are not shown. Oxide element 22 surrounds what will become PCMO resistor pillars, such as 24. In the view shown, a barrier metal layer 26 is depicted. A top electrode 28 would overly 24. FIG. 9 is a cross section view along line 9—9 of FIG. 8, depicting oxide element 22, brevet PCMO resistor pillars 24, p-well 11, $N^+$ layer 12, $P^+$ layer 14, barrier metal layer 16, bottom electrode 18, a PCMO layer 28 and a top electrode 30. FIG. 10 is a cross section view along line 10—10 of FIG. 8. As shown in the figures, the CMR memory pillar of each memory cell is isolated and is self-aligned to the bottom electrode, however, the top electrode and the CMR pillars are not self-aligned, thus the CMR resistance pillars are partially self-aligned with the other elements of the structure. The device is completed by fabrication of additional supporting electronics and metallization.

Thus, a method of fabricating self-aligned cross-point memory array has been disclosed. It will be appreciated that further variations and modifications thereof may be made within the scope of the invention as defined in the appended claims.

We claim:

1. A method of fabricating a self-aligned cross-point memory array, comprising:

preparing a substrate, including forming supporting electronic structures;

forming a p-well area on the substrate;

implanting ions to form a deep $N^+$ region;

implanting ions to form a shallow P+ region on the $N^+$ region;

depositing a barrier meal layer on the P+ region;

depositing a bottom electrode layer on the barrier metal layer;

depositing a sacrificial layer on the bottom electrode layer;

patterning and etching to move portions of the sacrificial layer, the bottom electrode layer, the barrier metal layer, the P+ region and the $N^+$ region to form a trench;

depositing oxide to fill the trench, thereby forming plural P+/N junction;

patterning and etching to remove portions of the sacrificial layer;

depositing a PCMO layer which is self-aligned with the remaining bottom electrode layer;

depositing a top electrode layers;

patterning and etching the top electrode layer; and completing the self-aligned cross-point memory array.

2. The method of claim 1 which includes formation of additional electronic structures and metallization after said patterning and etching the top electrode layer.

3. The method of claim 1 wherein said implanting ions to form a deep $N^+$ region includes implanting phosphorus ions at an energy of between about 60 keV to 200 keV and an ion dose of between about $5 \cdot 10^{14}$ ion/cm$^{-2}$ to $2-10^{15}$ ions/cm$^{-2}$.

4. The method of claim 3 wherein said implanting ions to form a deep $N^+$ region includes implanting multi energy phosphorus to reduce the resistivity of the $N^+$ region at an energy level of between about 100 keV to 250 keV and an ion dose of between about $1 \cdot 10^{14}$ ions/cm$^{-2}$ to $2 \cdot 10^{15}$ ions/cm$^{-2}$.

5. The method of claim 1 where said implanting ions to form a shallow $P^+$ region includes implanting $BF_2$ ions at an energy level of between about 20 keV to 60 keV and a dose of between about $1$–$10^{15}$ ions/cm$^{-2}$ to $5 \cdot 10^{15}$ ion/cm$^{-2}$.

6. The method of claim 1 wherein said depositing a barrier metal layer includes depositing a layer having a thickness of between about 10 nm to 50 nm of a barrier metal taken from the group of barrier metals consisting of TaN, TiN, WN, and TiTaN.

7. The method of claim 1 wherein said depositing a bottom electrode layer includes depositing a layer having a thickness of between about 50 nm to 300 nm of bottom electrode material taken from the group of electrode materials consisting of Pt and Ir.

8. The method of claim 1 wherein said depositing a layer of sacrificial material includes depositing a layer of material taken from the group of materials consisting of polysilicon and silicon nitride, having a thickness of between about 200 nm to 400 nm.

9. The method of claim 1 wherein said depositing a top electrode layer includes depositing a layer having a thickness of between about 50 nm to 300 nm of top electrode material taken from the group of electrode materials consisting of Pt and Ir.

10. A method of fabricating a self-aligned cross-point memory array having a partially aligned PCMO resistor pillar, comprising:

preparing a substrate, including forming any supporting electronic structures;

forming a p-well area on the substrate;

implanting ions to form a deep N$^+$ region;

implanting ions to form a shallow P+ region on the N$^+$ region to form a single, overlaying P+/N junction on the substrate;

depositing a barrier metal layer on the P+ region;

depositing a bottom electrode layer on the barrier metal layer;

depositing a sacrificial layer on the bottom electrode layer, which includes depositing a layer of material taken from the group of materials consisting of polysilicon and silicon nitride;

patterning and etching to remove portions of the sacrificial layer, the bottom electrode layer, the barrier metal layer, the P+ region and the N$^+$ region to form a trench;

depositing oxide to fill the trench, thereby forming plural P+/N junctions;

patterning and etching to remove portions of the sacrificial layer;

depositing a PCMO layer which is self-aligned with the remaining bottom electrode layer;

depositing top electrode layer;

patterning and etching the top electrode layer; and completing the self-aligned, cross-point memory array.

11. The method of claim 10 which further includes formation of additional electronic structures and metallization after said patterning and etching the top electrode layer.

12. The method of claim 10 wherein said implanting ions to form a deep N$^+$ region includes implanting phosphorus ions at an energy of between about 60 keV to 200 keV and an ion dose of between about $5 \cdot 10^{14}$ ions/cm$^{-2}$ to $2 \cdot 10^{15}$ ions/cm$^{-2}$.

13. The method of claim 12 wherein said implanting ions to form a deep N$^+$ region includes implanting multi energy phosphorus to reduce the resistivity of the N$^+$ region at an energy level of between about 100 keV to 250 keV and an ion dose of between about $1 \cdot 10^{14}$ ions/cm$^{-2}$ to $2 \cdot 10^{15}$ ions/cm$^{-2}$.

14. The method of claim 10 wherein said implanting ions to form a shallow P$^+$ region including implanting BF$_2$ ions at an energy level of between about 20 keV to 60 keV and a dose of between about $1 \cdot 10^{15}$ ions/cm$^{-2}$ to $5 \cdot 10^{15}$ ions/cm$^{-2}$.

15. The method of claim 10 wherein said depositing a barrier metal layer includes depositing a layer having a thickness of between about 10 nm to 50 nm of a barrier metal taken from the group of barrier metals consisting of TaN, TiN, WN, and TiTaN.

16. The method of claim 10 wherein said depositing a bottom electrode layer includes depositing a layer having a thickness of about 50 nm to 300 nm of bottom electrode material taken from the group of electrode materials consisting of Pt and Ir.

17. The method of claim 10 wherein said depositing a layer of sacrificial martial includes depositing a layer of sacrificial material having a thickness of between about 200 nm to 400 nm.

18. The method of claim 10 wherein said depositing a top electrode layer includes depositing a layer having a thickness of between about 50 nm to 300 nm of top electrode material taken from the group of electrode materials consisting of Pt and Ir.

19. A method of fabricating a self-aligned cross-point memory array, comprising:

preparing a substrate, including a forming supporting electronic structures;

forming a p-well area on the substrate;

implanting ions to form a deep N$^+$ region, including implanting phosphorus ions at an energy of between about 60 keV to 200 keV and an ion dose of between about $5 \cdot 10^{14}$ ions/cm$^{-2}$ to $2 \cdot 10^{15}$ ions/cm$^{-2}$;

implanting ions to form a shallow P+ region on the N$^+$ region to form a P+/N junction, including implanting BF$_2$ ions at an energy level of between about 20 keV to 60 keV and a dose of between about $1 \cdot 10^{15}$ $^{ions/cm-2}$ to $5 \cdot 10_{15}$ ions/cm$^{-2}$;

depositing a barrier metal layer on the P+ region, including depositing a layer having a thickness of between about 10 nm to 50 nm of a barrier metal taken from the group of barrier metals consisting of TaN, TiN, WN, and TiTaN;

depositing a bottom electrode layer on the barrier metal layer, including depositing a layer having a thickness of between about 50 nm to 300 nm of bottom electrode material taken from the group of electrode materials consisting of Pt and Ir;

depositing a sacrificial layer on the bottom electrode layer, including depositing a layer of material taken from the group of materials consisting of polysilicon and silicon nitride, having a thickness of between about 200 nm to 400 nm;

patterning and etching to remove portions of the sacrificial layer, the bottom electrode layer, the barrier metal layer, the P+ region and the N$^+$ region to form a trench;

depositing oxide to fill the trench;

patterning and etching to remove portions of the sacrificial layer;

depositing a PCMO layer which is self-aligned with the remaining bottom electrode layer;

depositing a top electrode layer;

patterning and etching the top electrode layer; and completing the self-aligned, cross-point memory array.

20. The method of claim 19 which further includes formation of additional electronic structures and metallization after said patterning and etching the top electrode layer.

21. The method of claim 19 wherein said implanting ions to form a deep $N^+$ region includes implanting multi phosphorus to reduce the resistivity of the $N^+$ region at an energy level of between about 100 keV to 250 keV and an ion dose of between about $1 \cdot 10^{14}$ ions/cm$^{-2}$ to $2 \cdot 10^{15}$ ions/cm$^{-2}$.

22. The method of claim 19 wherein said depositing a top electrode layer includes depositing a layer having a thickness of between about 50 nm to 300 nm of top electrode material taken from the group of electrode materials consisting of Pt and Ir.

* * * * *